United States Patent
Hidaka

(10) Patent No.: US 11,910,570 B2
(45) Date of Patent: Feb. 20, 2024

(54) HEAT SINK STRUCTURE FOR AUDIO EQUIPMENT

(71) Applicant: DENSO TEN Limited, Kobe (JP)

(72) Inventor: Noboru Hidaka, Kobe (JP)

(73) Assignee: DENSO TEN Limited, Kobe (JP)

( * ) Notice: Subject to any disclaimer, the term of this patent is extended or adjusted under 35 U.S.C. 154(b) by 247 days.

(21) Appl. No.: 17/528,735

(22) Filed: Nov. 17, 2021

(65) Prior Publication Data

US 2022/0377929 A1 Nov. 24, 2022

(30) Foreign Application Priority Data

May 21, 2021 (JP) .................................. 2021-086064

(51) Int. Cl.
  *H05K 7/20* (2006.01)
(52) U.S. Cl.
  CPC .................................. *H05K 7/2039* (2013.01)
(58) Field of Classification Search
  CPC .................................................. H05K 7/2039
  USPC .......................................................... 165/80.3
  See application file for complete search history.

(56) References Cited

U.S. PATENT DOCUMENTS

| | | | | |
|---|---|---|---|---|
| 2010/0091495 A1* | 4/2010 | Patrick | .................. | F21V 29/763 362/249.02 |
| 2010/0314985 A1* | 12/2010 | Premysler | .......... | G02B 19/0061 313/46 |
| 2011/0048675 A1* | 3/2011 | Xu | ....................... | H01L 23/3672 361/709 |
| 2014/0332182 A1* | 11/2014 | Taras | ...................... | H01L 23/44 165/80.3 |
| 2016/0178289 A1* | 6/2016 | Gonzalez | ............. | H01L 23/467 165/80.3 |
| 2016/0299545 A1* | 10/2016 | May | ........................ | G06F 1/187 |
| 2017/0300095 A1* | 10/2017 | Degner | .................... | G08B 5/36 |
| 2018/0077817 A1* | 3/2018 | Tang-Kong | ........... | H05K 7/2039 |

FOREIGN PATENT DOCUMENTS

| | | |
|---|---|---|
| JP | 2000-068427 A | 3/2000 |
| JP | 2018-098350 A | 6/2018 |

* cited by examiner

*Primary Examiner* — Claire E Rojohn, III
(74) *Attorney, Agent, or Firm* — Oliff PLC

(57) ABSTRACT

A heat sink structure that is used for audio equipment includes a base and a plurality of heat dissipation fins. The heat dissipation fins extend from a predetermined surface of the base in a first direction orthogonal to the predetermined surface. The heat dissipation fins are arranged side by side in a second direction orthogonal to the first direction. In a cross-section in a plane parallel to the first and second directions, (i) each of the heat dissipation fins has a first side surface and a second side surface, the first and second surfaces facing oppositely from each other in the second direction, and (ii) inclinations, relative to the predetermined surface, of the first and second side surfaces of adjacent ones of the heat dissipation fins are different from each other.

6 Claims, 5 Drawing Sheets

HEAT SINK STRUCTURE FOR AUDIO EQUIPMENT

BACKGROUND OF THE INVENTION

Field of the Invention

The invention relates to a heat sink structure for audio equipment.

Description of the Background Art

While audio equipment is being used, an electronic part, such as a power IC and a regulator generates heat. Thus, the audio equipment may include a heat sink that is provided directly to the heat-generating part, and/or that is provided to a housing that houses the heat-generating part. The heat sink includes, for example, a plurality of heat dissipation fins that are arranged side by side to have a large surface area. Thus, the heat sink dissipates heat via the heat dissipation fins to outside air. If such a heat sink having the heat dissipation fins arranged side by side is provided to the audio equipment, those heat dissipation fins vibrate and resonate at a specific frequency, like a tuning fork. When the vibration is transmitted to a circuit for audio signals, an element, such as an electronic part and a wire, of the circuit is vibrated. As a result, contact resistance, inductive voltage, etc. of the element are changed. Accordingly, there is a possibility that noise is added to the acoustic signals and/or the acoustic signals are distorted, which leads to a decrease in sound quality.

There is a technology that forms ribs on a plurality of fins in different portions from one another such that no fins vibrate at a same natural frequency to reduce resonance.

However, since the ribs are formed on the plurality of fins in different portions from one another, the fins have partially different widths from one another. In other words, the ribs project on the plurality of fins in a width direction. As a result, there is a problem that shapes of the fins are so complicated that it is difficult to manufacture the heat sink, for example, by casting, and manufacturing constrains are caused.

SUMMARY OF THE INVENTION

According to one aspect of the invention, a heat sink structure that is used for audio equipment includes a base and a plurality of heat dissipation fins. The heat dissipation fins extend from a predetermined surface of the base in a first direction orthogonal to the predetermined surface. The heat dissipation fins are arranged side by side in a second direction orthogonal to the first direction. In a cross-section in a plane parallel to the first and second directions, (i) each of the heat dissipation fins has a first side surface and a second side surface, the first and second surfaces facing oppositely from each other in the second direction, and (ii) inclinations, relative to the predetermined surface, of the first and second side surfaces of adjacent ones of the heat dissipation fins are different from each other.

An object of the invention is to provide an easy-manufacturing heat sink structure that reduces resonance of heat dissipation fins.

These and other objects, features, aspects and advantages of the invention will become more apparent from the following detailed description of the invention when taken in conjunction with the accompanying drawings.

DESCRIPTION OF THE EMBODIMENTS

Figure 1:
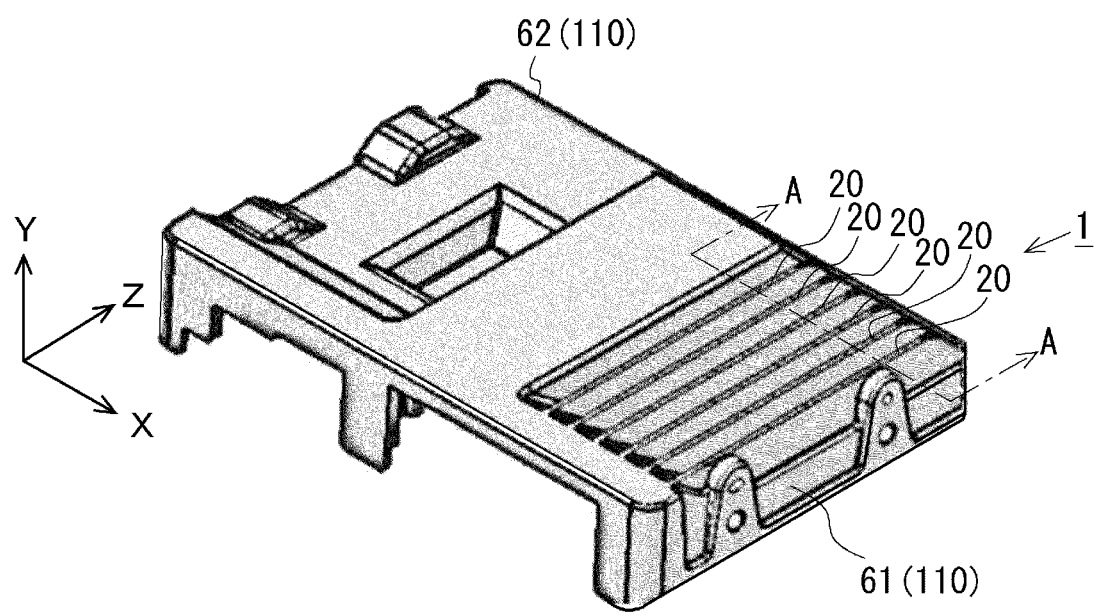
FIG. 1 is an external view of a housing to which a heat sink structure of this embodiment is applied.
Figure 2:
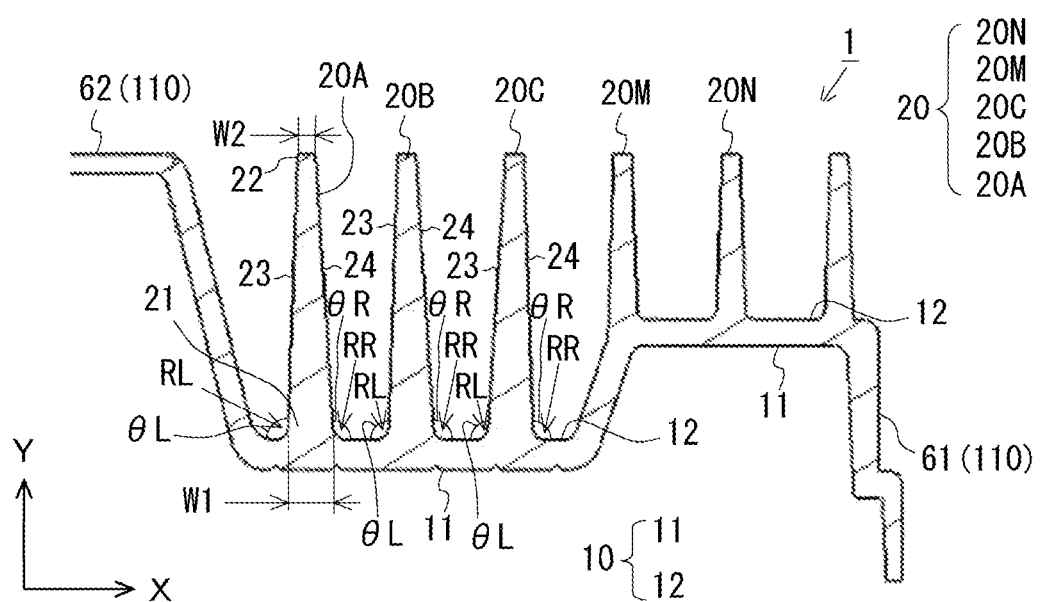
FIG. 2 is a cross-sectional view at line A-A in FIG. 1.
Figure 3:
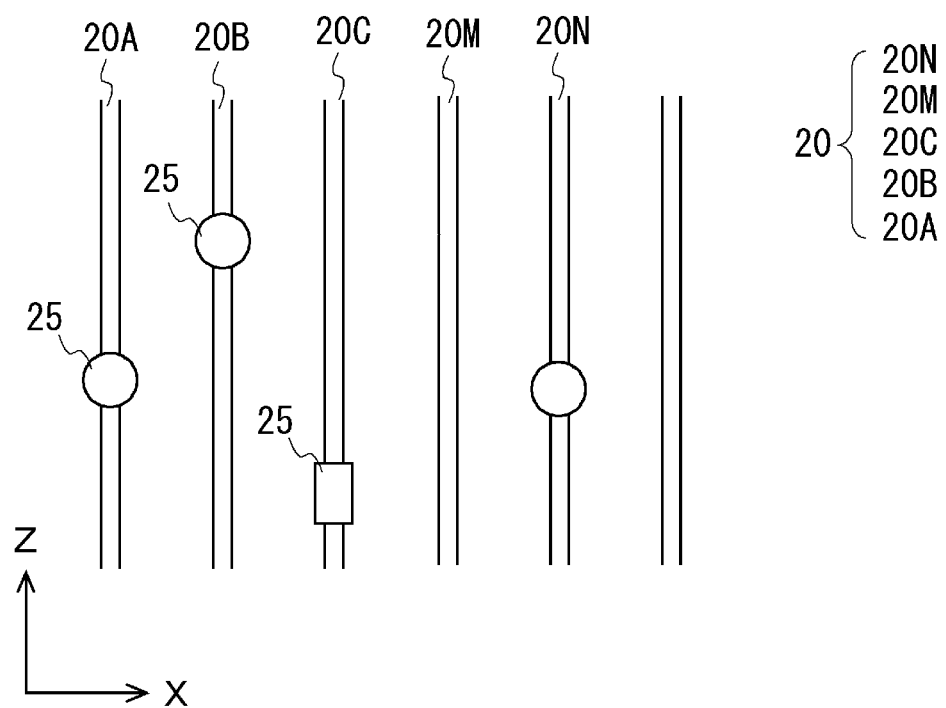
FIG. 3 is a plane view showing the heat sink structure of this embodiment.

With reference to the drawings, an embodiment of the invention will be described below. FIG. 1 is an external view of a housing to which a heat sink structure of this embodiment is applied. FIG. 2 is a cross-sectional view at line A-A in FIG. 1. FIG. 3 is a plane view showing the heat sink structure of this embodiment. In FIGS. 1 to 3, an X-axis shows a width direction, a Y-axis shows a height direction, and a Z-axis shows a longitudinal direction (front-back direction). These directions are only for easy understanding of an explanation, and a board member, a material, a part, etc. of this embodiment are not limited to be arranged in a direction shown in the drawings.

A heat sink structure 1 of this embodiment is applied to an audio amplifier 100. More specifically, as shown in FIG. 1, the heat sink structure 1 is provided to a housing 110 of the audio amplifier 100. The heat sink structure 1 includes a base 10 and a plurality of heat dissipation fins 20 that are arranged to extend from the base 10.

The base 10 is arranged to be a portion of the housing 110. The base 10 is a substantially board-shaped member, extending in the X direction and the Z direction. The base 10 includes a lower surface 11 that is positioned on an inner side of the housing 110 and an upper surface 12 that is parallel to the lower surface 11. The heat dissipation fins 20 are provided on the upper surface 12 (a predetermined surface).

The heat dissipation fins 20 are board-shaped members, extending from the upper surface 12 of the base 10 in a first direction (Y direction) orthogonal to the upper surface 12. The heat dissipation fins 20 are arranged side by side in a second direction (X direction) orthogonal to the first direction.

The heat sink structure 1 of this embodiment is an aluminum casted product (die-cast product) or an aluminum alloy casted product. The heat sink structure 1 is made by casing the base 10 and the heat dissipation fins 20 in a mold as one part. For example, the heat sink structure 1 is casted by injecting molten aluminum alloy into a space formed between mold-matched upper and lower molds arranged in a vertical direction. In this case, the casted heat sink structure 1 is removed from the molds in the Y direction. Thus, a draft angle is provided to the heat sink structure 1 in the Y direction. In an example shown in FIG. 2, as for each of the heat dissipation fins 20 of the heat sink structure 1, a width W2 of a tip portion 22 of each fin is smaller than a width W1 of a base end portion 21 of each fine on a side of the base 10. In other words, in an X-Y cross-sectional view of the heat dissipation fins 20, each of the heat dissipation fins 20 has two side surfaces that face oppositely from each other in the X direction, one of which is a first side surface 23 and the other is a second side surface 24. The first side surface 23 and the second side surface 24 of each of the heat dissipation fins 20 are tilted relative to the upper surface 12 of the base 10 such that a distance (width) between the side surfaces 23 and 24 of each fin is smaller as a portion of each fin is higher toward the tip portion 22 from the base end portion 21. Since each of the heat dissipation fins 20 are tapered, the heat dissipation fins 20 is formed to be removable from the upper mold.

Moreover, in the heat sink structure 1, as shown in FIG. 2, the draft angles of the heat dissipation fins 20 adjacent to each other in the Y direction are different.

In the example shown in FIG. 2, one of the heat dissipation fins 20 is shown as a heat dissipation fin 20A and another heat dissipation fin 20 adjacent to the heat dissipation fin 20A is shown as a heat dissipation fin 20B.

In the example shown in FIG. 2, an inclination θL of the first side surface 23 of the heat dissipation fin 20A is 88 degrees (°) relative to the upper surface 12 of the base 10. In other words, an inclination of the first side surface 23 of the heat dissipation fin 20A is 2° relative to the Y-axis. An inclination θR of the second side surface 24 of the heat dissipation fin 20A is 86° relative to the upper surface 12 of the base 10. In other words, an inclination of the second side surface 24 of the heat dissipation fin 20A is 4° relative to the Y-axis.

Meanwhile, an inclination θL of the first side surface 23 of the heat dissipation fin 20B is 86° relative to the upper surface 12 of the base 10. In other words, an inclination of the first side surface 23 of the heat dissipation fin 20B is 4° relative to the Y-axis. An inclination θR of the second side surface 24 of the heat dissipation fin 20B is 88° relative to the upper surface 12 of the base 10. In other words, an inclination of the second side surface 24 of the heat dissipation fin 20B is 2° relative to the Y-axis.

As described above, the inclinations, relative to the upper surface 12 of the base 10, of the first and second side surfaces 23 and 24 of adjacent ones of the heat dissipation fins 20 are different from each other. More specifically, the inclination θL of the first side surface 23 and the inclination θR of the second side surface 24 of the heat dissipation fin 20A are inverted from the inclination θL of the first side surface 23 and the inclination θR of the second side surface 24 of the heat dissipation fin 20B. In other words, cross-sectional shapes of the heat dissipation fin 20A and the heat dissipation fin 20B are formed to be symmetrical about the Y-axis.

Moreover, an inclination θL of the first side surface 23 of a heat dissipation fin 20C, adjacent to the heat dissipation fin 20B, is 88° relative to the upper surface 12 of the base 10, and an inclination θR of the second side surface 24 of the heat dissipation fin 20C is 86° relative to the upper surface 12 of the base 10. Thus, the inclination θL of the first side surface 23 and the inclination θR of the second side surface 24 of the heat dissipation fin 20B are inverted from the inclination θL of the first side surface 23 and the inclination θR of the second side surface 24 of the heat dissipation fin 20C. FIG. 2 shows the three heat dissipation fins 20A to 20C arranged side by side at a same height. However, the plurality of heat dissipation fins 20 may be four or more than four fins. In such a case, the inclinations, relative to the upper surface 12 of the base 10, of the first and second side surfaces 23 and 24 of adjacent ones of the heat dissipation fins 20 should be different from each other. More specifically, the inclination θL of the first side surface 23 and the inclination θR of the second side surface 24 of one of the heat dissipation fins 20 should be inverted from the inclination θL of the first side surface 23 and the inclination θR of the second side surface 24 of another fin adjacent to the one fin to make different cross-sectional shapes of those fins adjacent to each other, as shown in an explanation of the cross-sectional shapes of the heat dissipation fin 20A and the heat dissipation fin 20B as described above. The heat sink structure 1 of this embodiment has the heat dissipation fins 20, and the heat dissipation fins 20 adjacent to each other have the different draft angles such that the cross-sectional shapes of the heat dissipation fins 20 adjacent to each other are different. Thus, resonance of the heat dissipation fins 20 adjacent to each other is reduced.

Moreover, the heat dissipation fin 20A has a curvature radius RL of 1 mm of a connecting portion between the first side surface 23 and the upper surface 12 of the base 10, and has a curvature radius RR of 2 mm of a connecting portion between the second side surface 24 and the upper surface 12 of the base 10. Meanwhile, the heat dissipation fin 20B has a curvature radius RL of 2 mm of a connecting portion between the first side surface 23 and the upper surface 12 of the base 10, and has a curvature radius RR of 1 mm of a connecting portion between the second side surface 24 and the upper surface 12 of the base 10.

Thus, in the cross-section of the heat dissipation fins, the radiuses of the curvature of the connecting portions between the first and second side surfaces 23 and 24 and the upper surface 12 of the base 10 of the adjacent ones of the heat dissipation fins 20 are different from each other. More specifically, the curvature radiuses RL and RR of the connecting portions of the base end portion of the heat dissipation fin 20A are inverted from the curvature radiuses RL and RR of the connecting portions of the base end portion 21 of the heat dissipation fin 20B.

Further, the heat dissipation fin 20C, adjacent to the heat dissipation fin 20B, has a curvature radius RL of 1 mm of a connecting portion between the first side surface 23 and the upper surface 12 of the base 10, and has a curvature radius RR of 2 mm of a connecting portion between the second side surface 24 and the upper surface 12 of the base 10. Thus, the curvature radiuses RL and RR of the connecting portions of the base end portion of the heat dissipation fin 20B are inverted from the curvature radiuses RL and RR of the connecting portions of the base end portion of the heat dissipation fin 20C. FIG. 2 shows the three heat dissipation fins 20A to 20C arranged side by side at the same height. However, the heat dissipation fins 20 may be four or more than four fins. In such a case, in the cross-section of the heat dissipation fins 20, the radiuses of the curvature of the connecting portions between the first and second side surfaces 23 and 24 and the upper surface 12 of the adjacent ones of the heat dissipation fins 20 should be different from each other. More specifically, the curvature radiuses RL and RR of the connecting portions of the side surfaces 23 and 24 of one of the fins should be inverted from the curvature radiuses RL and RR of the connecting portions of the side surfaces 23 and 24 of another fin adjacent to the one fin to make different cross-sectional shapes of the fins adjacent to each other, as shown in the explanation of the cross-sectional shapes of the heat dissipation fin 20A and the heat dissipation fin 20B.

As described above, in the heat sink structure 1 of this embodiment, the radiuses of the curvature, i.e. shapes of the curvature, of the connecting portions of the adjacent ones of the heat dissipation fins 20 are different from each other such that the cross-sectional shapes of the adjacent ones of the heat dissipation fins 20 are different from each other. Thus, resonance of the adjacent ones of the heat dissipation fins 20 is reduced.

The heat sink structure 1 of this embodiment further includes heat dissipation fins 20M and 20N that have a different height from the height of the heat dissipation fins 20A to 20C. The heat dissipation fins 20M and 20N have the same height. A draft angle and curvature of the connecting portions of the heat dissipation fin 20M adjacent to the heat dissipation fin 20N at the same height, are different from a draft angle and curvature of the connecting portions of the heat dissipation fin 20N, like the heat dissipation fins 20A to 20C as described above. The height of the heat dissipation fin 20C is different from the height of the heat dissipation fin 20M. Thus, the cross-sectional shape of the heat dissipation fin 20C is different from a cross-sectional shape of the heat dissipation fin 20M regardless of the draft angles of those fins. Therefore, the inclinations and the curvature of the connecting portions of those fins may be same or different.

Figure 4:
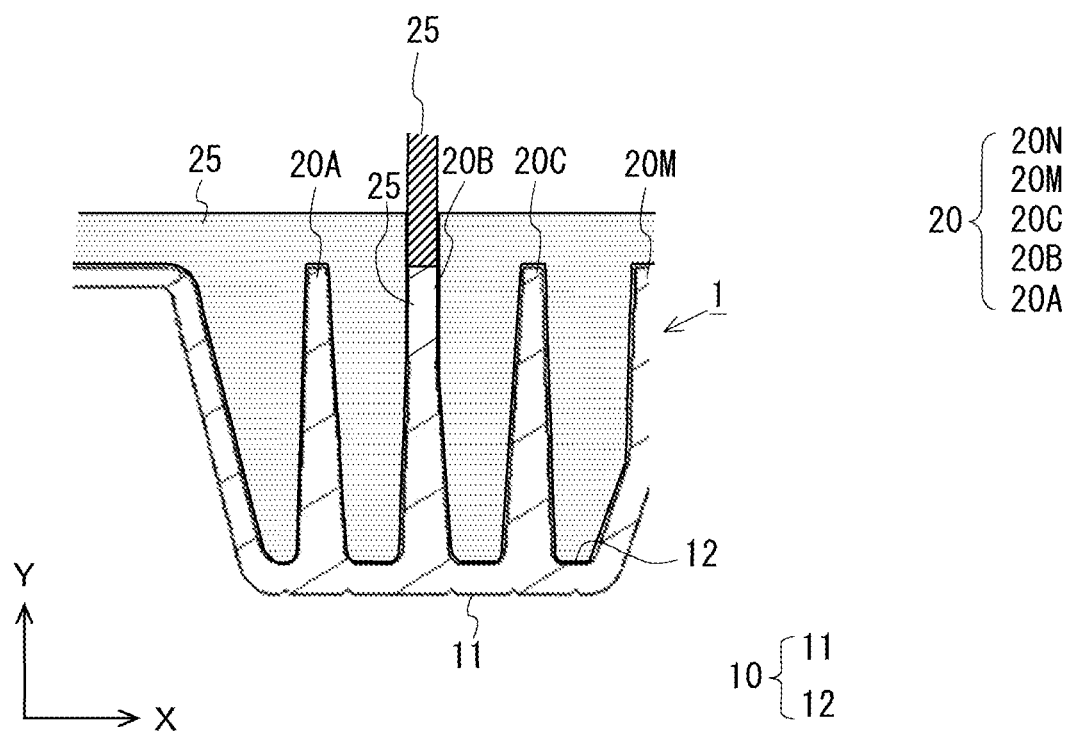
FIG. 4 shows an explanation for removing the heat sink structure from a mold.

The heat sink structure 1 of this embodiment includes a pressure receiving portion 25 as shown in FIG. 3. The pressure receiving portion 25 is formed on the tip portion 22 of each of the heat dissipation fins 20 and has a wider width than other portions of the fin 20. As shown in FIG. 4, after the heat sink structure 1 is casted, the pressure receiving portion 25 is pushed with a pushout pin 42 so that the heat sink structure 1 is removed from an upper mold 41. If the pressure receiving portions 25 are formed in a same manner on the heat dissipation fins 20 adjacent to each other, resonance may be generated. Thus, the pressure receiving portions 25 on the heat dissipation fins 20 adjacent to each other are formed in different positions in the depth direction (Z direction). As a result, since the cross-sectional shapes of the heat dissipation fins 20 adjacent to each other are different, resonance of the heat dissipation fins 20 adjacent to each other is reduced.

Figure 5:
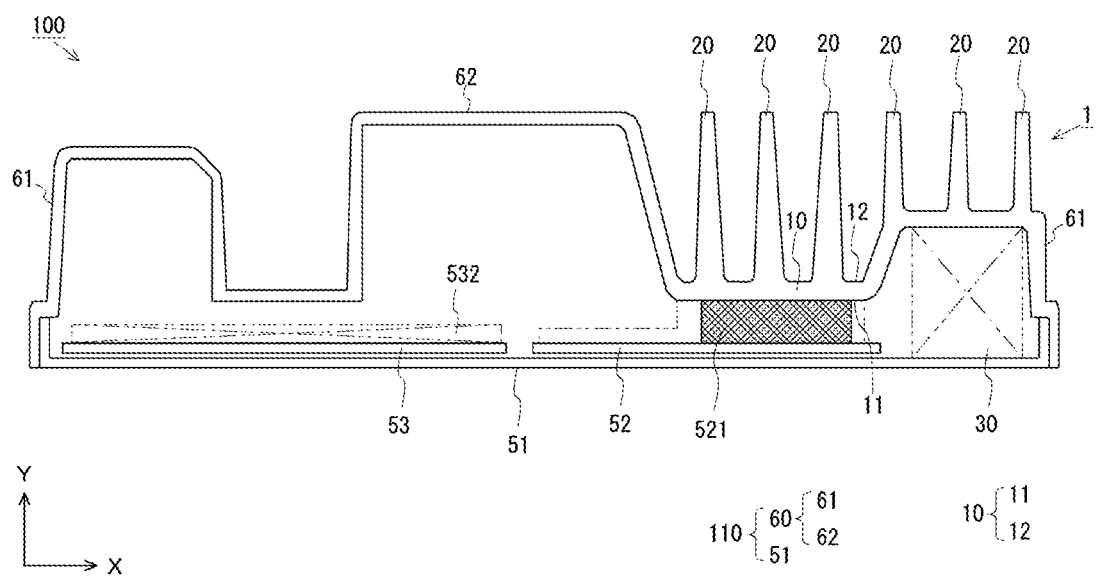
FIG. 5 shows a structure of an audio amplifier of this embodiment.

FIG. 5 shows a structure of the audio amplifier 100 of this embodiment. A circuit board 52 and a circuit board 53 are arranged on a bottom plate 51 of the audio amplifier 100. The circuit board 52 includes an electronic part 521, such as a power IC and a regulator, that is a heat source. Further, the circuit board 53 includes a circuit 532 that performs signal processing, such as transmission, conversion, amplification, and output of an audio signal that is input from another device, apparatus, and the like.

Further, a circuit 30, such as a power transformer, an electrolytic capacitor, and a switching element, that is a heat source, is arranged on the bottom plate 51. The circuit 30 and the electronic part 521 are also vibration sources that generate micro vibrations when the circuit 30 and the electronic part 521 are used.

An upper cover 60 is attached to the bottom plate 51 with a fastener, such as a screw. The upper cover 60 includes side panels 61 and a top panel 62. The side panels 61 form side surfaces of the housing 110. The top panel 62 is connected to top end portions of the right and left side panels 61 and forms an upper surface of the housing 110. The heat sink structure 1 of this embodiment is formed with the upper cover 60 as one unit and the base 10 is arranged to be a portion of the top panel 62.

In addition, the housing 110 is shaped like a case including a front panel, not illustrated, that forms a front surface and a rear panel, not illustrated, that forms a rear (back) surface. As described above, the audio amplifier 100 of this embodiment houses the circuit 532 that performs the signal processing and other parts, such as the circuit 30 and the electronic part 521, that are heat sources and/or the vibration sources, inside the housing 110. The electronic part 521 is arranged in contact with an inside surface of the top panel 62, i.e., the lower surface 11 of the heat sink structure 1. Heat is released to an outside of the housing 110 via the heat sink structure 1.

Effect

As described above, in the X-Y cross-section of the plurality of heat dissipation fins 20 arranged side by side in the heat sink structure 1 of this embodiment, the first and second side surfaces 23 and 24 of the heat dissipation fins 20 adjacent to each other in the second direction (X direction) have the different inclinations relative to the base 10. In other words, the inclinations, relative to the base 10, of the first and second side surfaces 23 and 24 of adjacent ones in the second direction of the heat dissipation fins 20 are different from each other.

Thus, due to different resonance points caused by the different cross-sectional shapes of the adjacent ones of the heat dissipation fins, the heat sink structure 1 of this embodiment reduces resonance of the heat dissipation fins adjacent to each other.

Further, in the X-Y cross-section of the heat dissipation fins 20 in the heat sink structure 1 of this embodiment, the curvature of the connecting portions between the base 10 and the first and second side surfaces 23 and 24 of adjacent ones of the heat dissipation fins 20 is different from each other in the second direction. Thus, due to the different resonance points caused by the different cross-sectional shapes of the adjacent ones of the heat dissipation fins, the heat sink structure 1 of this embodiment reduces resonance of the heat dissipation fins adjacent to one another.

Further, in the X-Y cross-section of the plurality of heat dissipation fins 20 in the heat sink structure 1 of this embodiment, the heat dissipation fins 20 has the two side surfaces that face the second direction, one of which is the first side surface 23 and the other is the second side surface 24, and the inclinations of the first and second side surfaces 23 and 24 of adjacent ones of the heat dissipation fins 20 are different from each other, more specifically, inverted from each other. Thus, due to the different resonance points caused by the different cross-sectional shapes of the adjacent ones of the heat dissipation fins, the heat sink structure 1 of this embodiment reduces resonance of the heat dissipation fins adjacent to each other.

Further, in the heat sink structure 1 of this embodiment, the base 10 is configured to be the portion of the housing 110 of the audio amplifier 100 (audio equipment), which reduces resonance of the heat sink structure 1 caused by micro vibrations that are generated by a vibration source in the audio amplifier 100. As a result, an effect on the signal circuit that is caused by resonance of the heat sink structure 1 is reduced, and a decrease in sound quality of the audio amplifier 100 can be prevented.

Others

In addition to the audio amplifier 100, the audio equipment may be an audio tuner, an image recorder, an audio player, and the like that includes a circuit that performs audio signal processing.

While the invention has been shown and described in detail, the foregoing description is in all aspects illustrative and not restrictive. It is therefore understood that numerous other modifications and variations can be devised without departing from the scope of the invention.

What is claimed is:
1. A heat sink structure that is used for audio equipment, the heat sink structure comprising:
   a base; and
   a plurality of heat dissipation fins that extend from a predetermined surface of the base in a first direction orthogonal to the predetermined surface, the heat dissipation fins being arranged side by side in a second direction orthogonal to the first direction, wherein in a cross-section in a plane parallel to the first and second directions, each of the heat dissipation fins has (i) a first side surface and a second side surface, the first and second side surfaces facing oppositely from each other in the second direction, (ii) a first side surface inclination angle θL which is an angle between the first side surface and the predetermined surface and (iii) a second side surface inclination angle θR which is an angle between the second side surface and the predetermined surface, and for each of the heat dissipation fins, (1) a value of θL is different from the value of θL of an adjacent one of the heat dissipation fins, and (2) a value of θR is different from the value of θR of the adjacent one of the heat dissipation fins.

2. The heat sink structure according to claim 1, wherein in the cross-section of the heat dissipation fins, radiuses of curvature of connecting portions between the first and second side surfaces and the predetermined surface of the adjacent ones of the heat dissipation fins are different from each other.

3. The heat sink structure according to claim 1, wherein in the cross-section of the heat dissipation fins, (a) for one of the heat dissipation fins, the first side surface inclination angle θL has a first value and the second side surface inclination angle θR has a second value different from the first value, and (b) for heat dissipation fins adjacent to the one of the heat dissipation fins, the first side surface inclination angle θL has the second value and the second side surface inclination angle θR has the first value.

4. The heat sink structure according to claim 1, wherein the base is configured to be a portion of a housing of the audio equipment.

5. The heat sink structure according to claim 1, wherein for each of the heat dissipation fins, the first side surface inclination angle θL has a value that is different from a value of the second side surface inclination angle θR.

6. The heat sink structure according to claim 1, wherein the value of θL is different from the value of θR for each one of the plurality of heat dissipation fins, and for every two adjacent heat dissipation fins of the plurality of heat dissipation fins, the value of θR for the second side surface of a first one of the two adjacent heat dissipation fins is equal to the value of θL for the first side surface of a second one of the two adjacent heat dissipation fins that faces toward the second side surface of the first one of the two adjacent heat dissipation fins.

* * * * *